US011216250B2

(12) United States Patent
Malaya et al.

(10) Patent No.: US 11,216,250 B2
(45) Date of Patent: Jan. 4, 2022

(54) DYNAMIC, VARIABLE BIT-WIDTH NUMERICAL PRECISION ON FIELD-PROGRAMMABLE GATE ARRAYS FOR MACHINE LEARNING TASKS

(71) Applicant: Advanced Micro Devices, Inc., Sunnyvale, CA (US)

(72) Inventors: Nicholas P. Malaya, Austin, TX (US); Elliot H. Mednick, Boxborough, MA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 517 days.

(21) Appl. No.: 15/833,287

(22) Filed: Dec. 6, 2017

(65) Prior Publication Data
US 2019/0171420 A1 Jun. 6, 2019

(51) Int. Cl.
*G06F 7/57* (2006.01)
*G06N 3/04* (2006.01)
(Continued)

(52) U.S. Cl.
CPC ............... *G06F 7/57* (2013.01); *G06N 3/04* (2013.01); *G06N 3/063* (2013.01); *G06N 3/08* (2013.01);
(Continued)

(58) Field of Classification Search
CPC ....... G06F 2207/3824; G06F 2207/382; G06F 2207/4824; G06F 30/20; G06F 7/38;
(Continued)

(56) References Cited

U.S. PATENT DOCUMENTS

| 8,150,902 B2* | 4/2012 | Bates | H03K 19/17728 |
| | | | 708/524 |
| 8,429,385 B2* | 4/2013 | Vorbach | G06F 9/30036 |
| | | | 712/37 |

(Continued)

OTHER PUBLICATIONS

Rao et al.; "An FPGA implementation of high speed and area efficient double-precision floating point multiplier using Urdhva Tiryagbhyam technique"; 2015 Conference on Power, Control, Communication and Computational Technologies for Sustainable Growth (PCCCTSG); Conference Paper; Publisher: IEEE (Year: 2015).*

(Continued)

*Primary Examiner* — Helen Rossoshek
(74) *Attorney, Agent, or Firm* — Liang & Cheng, PC (57) ABSTRACT

A method includes providing a set of one or more computational units implemented in a set of one or more field programmable gate array (FPGA) devices, where the set of one or more computational units is configured to generate a plurality of output values based on one or more input values. The method further includes, for each computational unit of the set of computational units, performing a first calculation in the computational unit using a first number representation, where a first output of the plurality of output values is based on the first calculation, determining a second number representation based on the first output value, and performing a second calculation in the computational unit using the second number representation, where a second output of the plurality of output values is based on the second calculation.

20 Claims, 7 Drawing Sheets

(51) Int. Cl.
*H03K 19/17728* (2020.01)
*G06N 3/08* (2006.01)
*G06N 3/063* (2006.01)
*G06F 7/544* (2006.01)

(52) U.S. Cl.
CPC ....... *H03K 19/17728* (2013.01); *G06F 7/544* (2013.01); *G06F 2207/382* (2013.01); *G06F 2207/4824* (2013.01)

(58) Field of Classification Search
CPC ........ G06F 7/49915; G06F 7/57; G06F 7/544; G06N 3/063; G06N 3/04; G06N 3/0454; G06N 3/08; H03K 19/17728
See application file for complete search history.

(56) References Cited

U.S. PATENT DOCUMENTS

| | | | | |
|---|---|---|---|---|
| 8,686,549 | B2* | 4/2014 | Vorbach | G06F 9/30036 |
| | | | | 257/686 |
| 8,706,790 | B1* | 4/2014 | Langhammer | G06F 7/4876 |
| | | | | 708/495 |
| 9,779,061 | B2* | 10/2017 | Angerer | G06F 17/12 |
| 10,353,706 | B2* | 7/2019 | Kaul | G06F 7/5443 |
| 10,474,458 | B2* | 11/2019 | Kaul | G06N 3/08 |
| 10,579,383 | B1* | 3/2020 | Rotem | G06F 9/3555 |
| 2014/0089609 | A1* | 3/2014 | Kegel | H01L 23/49827 |
| | | | | 711/154 |
| 2014/0172344 | A1* | 6/2014 | Laird | G01R 31/2894 |
| | | | | 702/117 |
| 2014/0181387 | A1* | 6/2014 | Poremba | G11C 7/1072 |
| | | | | 711/105 |
| 2014/0181389 | A1* | 6/2014 | Poremba | G06F 12/084 |
| | | | | 711/105 |
| 2015/0234783 | A1* | 8/2015 | Angerer | G06F 17/12 |
| | | | | 708/520 |
| 2017/0011288 | A1* | 1/2017 | Brothers | G06F 9/30036 |
| 2018/0157465 | A1* | 6/2018 | Bittner | G06N 3/063 |
| 2018/0314935 | A1* | 11/2018 | Lewis | G06N 3/0445 |
| 2018/0315398 | A1* | 11/2018 | Kaul | G06F 9/3851 |
| 2018/0322607 | A1* | 11/2018 | Mellempudi | G06F 17/153 |
| 2019/0205746 | A1* | 7/2019 | Nurvitadhi | G06N 3/0445 |
| 2019/0286973 | A1* | 9/2019 | Kovvuri | G06N 3/04 |
| 2019/0369988 | A1* | 12/2019 | Kaul | G06F 7/5443 |

OTHER PUBLICATIONS

Anane et al.; "Hardware implementation of Variable Precision Multiplication on FPGA"; 2009 4th International Conference on Design & Technology of Integrated Systems in Nanoscal Era; Conference Paper; Publisher: IEEE (Year: 2009).*

DiCecco et al.; "FPGA-based training of convolutional neural networks with a reduced precision floating-point library"; 2017 International Conference on Field Programmable Technology (ICFPT); Conference Paper; Publisher: IEEE (Year: 2017).*

Strzodka et al.; "Pipelined Mixed Precision Algorithms on FPGAs for Fast and Accurate PDE Solvers from Low Precision Components"; 2006 14th Annual IEEE Symposium on Field-Programmable Custom Computing Machines; Conference Paper; Publisher: IEEE (Year: 2006).*

Sze, Vivienne, et al. "Efficient processing of deep neural networks: A tutorial and survey." arXiv preprint arXiv:1703.09039 (2017).

* cited by examiner

DYNAMIC, VARIABLE BIT-WIDTH NUMERICAL PRECISION ON FIELD-PROGRAMMABLE GATE ARRAYS FOR MACHINE LEARNING TASKS

BACKGROUND

A field-programmable gate array (FPGA) is an integrated circuit device that is designed to be configured by an end user after manufacturing. In general, an FPGA includes an array of uncommitted circuit elements, called logic blocks, that are connected together by interconnect resources making up a programmable interconnect fabric. The interconnect resources may include, for example, logic gates that can be inter-wired in different configurations. The logic blocks in the FPGA can be configured to perform complex combinational functions, or logic functions such as AND or XOR. Logic blocks in an FPGA can also include memory elements, which may be implemented as simple flip-flops or more complete blocks of memory.

In an FPGA, the logic blocks can include elements such as lookup tables (LUTs) and other fixed functions that are programmed by inserting values into small Static Random Access Memories (SRAMs) or registers. The programming must be performed before the logic blocks can be used. After programming, each combination of function inputs to an LUT results in a predefined output, allowing implementation of any logic function. A typical FPGA relies on an external memory device and a single, relatively slow serial programming port for configuration. The FPGA typically has a "configuration mode" and a separate "user mode" where the entire chip is either in an idle state waiting to be programmed, or the programmed chip is running.

BRIEF DESCRIPTION OF THE DRAWINGS

The present disclosure is illustrated by way of example, and not by way of limitation, in the figures of the accompanying drawings.

DETAILED DESCRIPTION

The following description sets forth numerous specific details such as examples of specific systems, components, methods, and so forth, in order to provide a good understanding of the embodiments. It will be apparent to one skilled in the art, however, that at least some embodiments may be practiced without these specific details. In other instances, well-known components or methods are not described in detail or are presented in a simple block diagram format in order to avoid unnecessarily obscuring the embodiments. Thus, the specific details set forth are merely exemplary. Particular implementations may vary from these exemplary details and still be contemplated to be within the scope of the embodiments.

Modern computing systems can benefit from performing certain types of computations using reduced precision in order to reduce power consumption and improve performance. For a variety of tasks in computing, particularly machine learning, some key computations are not sensitive to reduced numerical precision. Different levels of precision may thus be optimal for different machine learning tasks and network architectures. For example, some types of tasks or architectures may optimally use 64 bit floating point number representations, while in others, 32 bit, 16 bit, or 8 bit integers are optimal. In extreme cases even binary or ternary representations may be used.

However, while such reduced precision computations may improve performance relative to currently available devices, it is costly and cumbersome to individually extend devices to support different specified levels of precision. Furthermore, the long cycle time for implementing different precision levels in conventional hardware is impractical for most application users. Implementing support for reduced precision computations in conventional hardware systems for niche products or domains can also be prohibitively costly due to the cost of implementing extensions to instruction sets in these systems.

In one embodiment, the reconfigurable nature of field programmable gate array (FPGA) devices in a computing system allows the system to support a wide range of numerical precisions and to dynamically vary the precision for key computations at run time. This capability enables optimally efficient computation and provides a competitive advantage (via reductions in energy use, memory access, and computational cost achieved by reducing unnecessary precision) over conventionally operating devices. In one embodiment, the numerical precision is varied during the entire calculation, or varies between specific computational steps (e.g., mixed precision).

Figure 1:
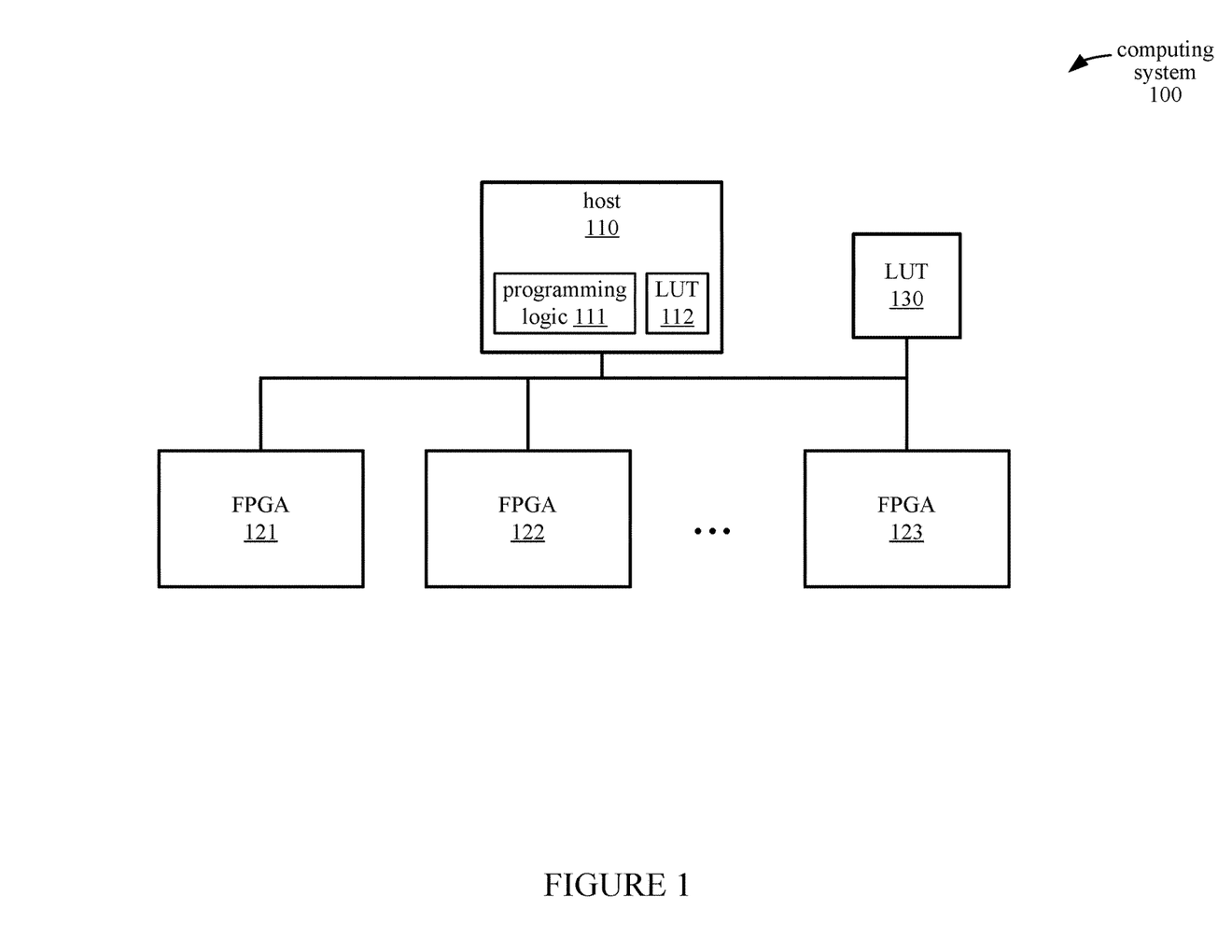
FIG. 1 illustrates an embodiment of a computing system that supports variable precision in a set of field programmable gate array (FPGA) devices.

FIG. 1 illustrates a block diagram of a computing system 100 that includes a host device 110 connected to a set of FPGA devices 121-123, according to an embodiment. In one embodiment, the host device 110 is a remote computer that is connected to the FPGA devices 121-123 through a network. Alternatively, the host device 110 can be located in the same physical chassis as the FPGA devices 121-123 or on the same carrier board. The host device 110 can include a processor and memory storing instructions that can be executed by the processor. In one embodiment, the host device 110 provides an interface through which a user can define configurations and specify tasks to be executed in the FPGA devices 121-123. While FIG. 1 illustrates only three of the FPGA devices 121-123, the computing system 100 may include an arbitrary number of FPGA devices; alternatively, the computing system may include as few as one FPGA device.

The host device 110 includes programming logic 111 that programs the FPGA devices 121-123 according to the configurations specified by the user. In an alternative embodiment, programming logic for reconfiguring the FPGA devices 121-123 may be located on the FPGA devices 121-123 themselves, or may be located in a separate integrated circuit chip on the same carrier board as the FPGA devices 121-123.

The computing system 100 includes a lookup table (LUT) 130, which is used for storing information used for changing the number representations used in the FPGA devices 121-

123. The LUT 130 can include information about computational patterns for the configured circuits in the FPGA devices 121-123 (e.g., information about how outputs are affected by the number representations being used). In one embodiment, the LUT 130 is connected to the FPGA devices 121-123 via a network connection; alternatively, the LUT 130 can be located in a dedicated integrated circuit chip in the same physical chassis as the FPGA devices 121-123, or on the same carrier board. In one embodiment, the LUT 130 is located in one or more of the FPGA devices 121-123 themselves. The host 110 can alternatively store this information in LUT 112.

Figure 2:
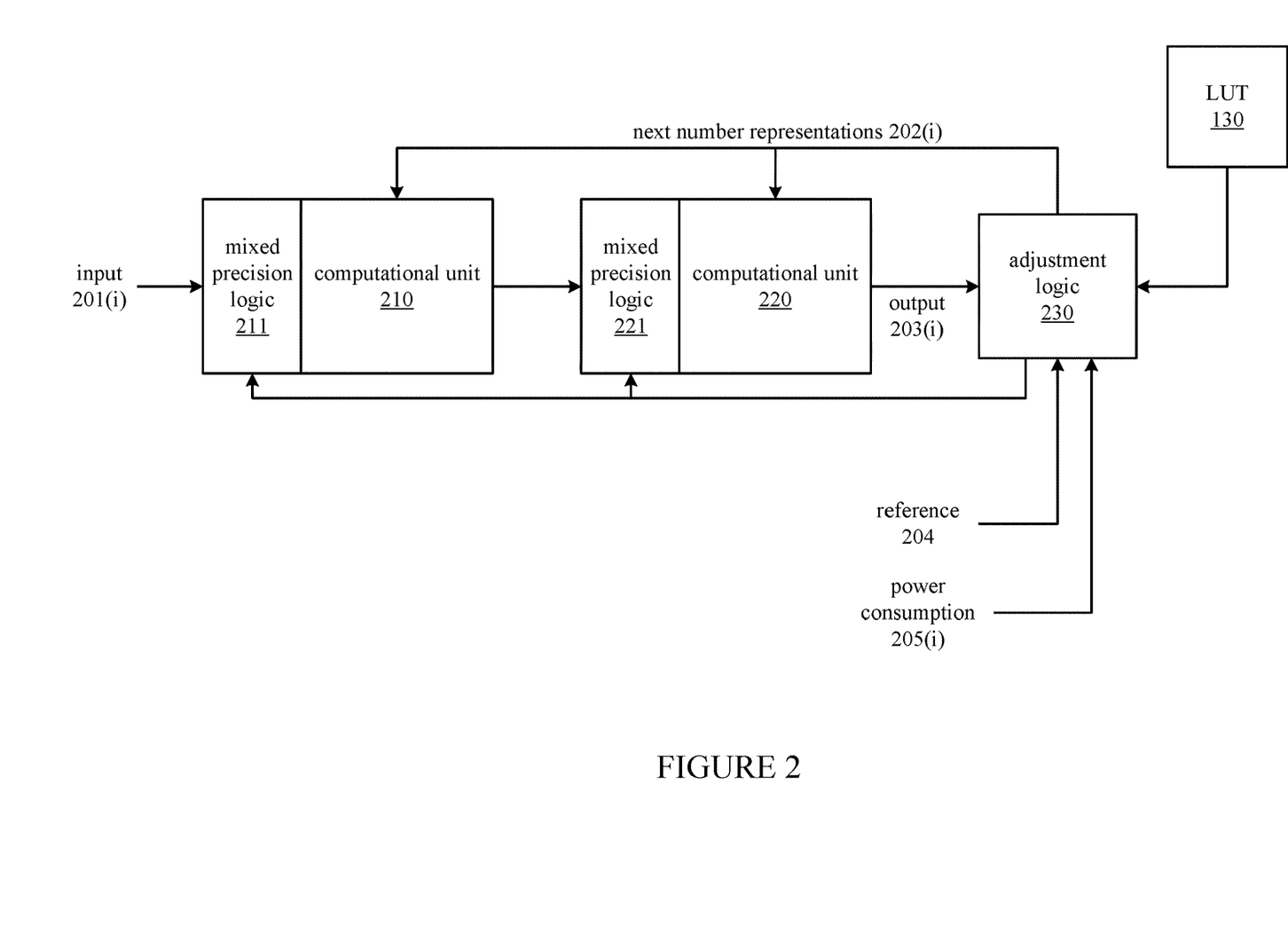
FIG. 2 illustrates computational units implemented in a set of FPGA devices, according to an embodiment.

FIG. 2 illustrates a functional block diagram for a set of computational units 210 and 220 implemented in one or more of the FPGAs 121-123, according to an embodiment. The components illustrated in FIG. 2 can represent circuitry contained within one FPGA device, or may be distributed over multiple FPGA devices. Each of the computational units 210 and 220 are circuits implemented by configuring one or more configurable logic blocks (CLBs) of one or more of the FPGA devices 121-123. Each of the computational units 210 and 220 has at least one input and at least one output. The computational units 210 and 220 each generate output values based on one or more input values. Collectively, the set of computational units 210 and 220 generates an output 203($i$) based on input 201($i$). Over time, the computational units 210 and 220 generate multiple outputs 203($i$) over multiple iterations i, where i designates the iteration in which the signal is produced. In one embodiment, one or both of the computational units 210 and 220 calculate a first output value 203(1) using a first number representation, then calculate a second output value 203(2) using a second number representation. For example, the computational unit 220 may calculate the first output value 203(1) using a 16-bit floating point representation, then calculate the second output value 203(2) using a 32-bit floating point representation. While FIG. 2 illustrates two computational units 210 and 220, alternative embodiments can include an arbitrary number of computational units connected to each other according to various topologies.

The adjustment logic 230 controls which number representations are used in the computational units 210 and 220. In one embodiment, the adjustment logic 230 is located in the host device 110. Alternatively, the adjustment logic 230 can be located in one or more of the FPGA devices 121-123. The different number representations (corresponding to different levels of precision) selected by the adjustment logic 230 to be used in the computational units 210 and 220 can be specified by a user during creation of the architecture, determined at runtime based on repeated iterations of executing a particular task (e.g., a machine learning 'inference' task), or dynamically determined before execution by a heuristic.

In one embodiment, the adjustment logic 230 determines which number representations are used in the computational units 210 and 220 based on an output of the computational units 210 and 220. For example, for the computational units 210 and 220 generating an output 203(1) based on the input 201(1), the adjustment logic 230 determines the accuracy of the output 203(1) by comparing the output 203(1) to a reference value 204, and based on this determination, outputs the next number representations 202(1) (e.g., 16 bit float, 32-bit float, 8 bit integer, etc.) to be used in the computational units 210 and 220 for the next iteration 2 (i.e., i=2). The adjustment logic 230 may select different number representations 202(1) for each of the computational units 210 and 220, or may select the same number representations 202(1) for both of the computational units 210 and 220.

In one embodiment, the adjustment logic 230 also determines the next number representations 202($i$) based on the power consumption 205($i$) for calculating the output 203($i$), since increased precision of the calculation corresponds to increased power consumption. Accordingly, the adjustment logic 230 can increase or decrease the precision of the calculation in computational units 210 and 220 by changing the number representations 202($i$) until a target power consumption is reached. In one embodiment, this adjustment can be constrained by a minimum acceptable accuracy, so that the power consumption can be decreased as long as the minimum level of accuracy can be maintained. Similarly, the adjustment logic 230 can adjust the precision of the calculations performed by the computational units 210 and 220 to optimize for speed of execution rather than for power consumption.

In one embodiment, the adjustment logic 230 changes the number representations 202($i$) used in the computational units 210 and 220 until a change is detected in the output value 203($i$). For example, the adjustment logic 230 may compare subsequent output values (e.g., 203(1) and 203(2)) and based on the comparison, adjust the next number representations 202(2) to be used in the computational units 210 and 220 for the next iteration 3. If the output values 203(1) and 203(2) are equal, the adjustment logic 230 generates a next number representation 202(2) for the computational units 210 and 220 that has fewer bits or a different allocation of bits than the number representations used in the previous iteration 2. If the output value 203(2) has changed relative to the prior output value 203(1), the adjustment logic 230 reverts to the previous number representations for the computational units 210 and 220 used in iteration 1. By this approach, the least costly number representations (in terms of power usage, execution time, etc.) that do not change the final output 203($i$) can be determined.

In one embodiment, the adjustment logic 230 determines the appropriate number representations 202($i$) to use for each computational unit 210 and 220 and for each iteration using a lookup table (LUT) 130. The number representations 202($i$) may be determined by the adjustment logic 230 based on information stored in the LUT 130 in conjunction with the output 203($i$) and power consumption 205($i$).

In general, the LUT 130 can be used to store any information that can be used for determining which number representations 202($i$) to use in the computational units 210 and 220. In one embodiment, the LUT 130 stores values correlating each of the computational units 210 and 220 with one or more corresponding number representations. The LUT 130 may also store values indicating how to adjust the number representations 202($i$) in response to particular changes in the output 203($i$) and/or the power consumption 205($i$). The LUT 130 also stores the number representations themselves, indicating the number of bits to use for each field for each of the representations. In one embodiment, the LUT 130 correlates a particular application with precision levels for the application. When execution is started, the LUT 130 provides the corresponding number representations to be used in each of the computational units for executing the application, and the computational units are configured accordingly. In one embodiment, the LUT 130 provides appropriate precision levels to be used in the computational units based on information about the computation, such as the magnitude of the input size (e.g., whether the input value is a small or large number), the number of inputs (a larger number of inputs is more likely to overflow), a desired accuracy for the final output value, etc. In one embodiment, the LUT 112 in the host device 110 may be used instead of or in addition to the LUT 130.

Having determined the appropriate next number representations 202(i) from the LUT 130 and/or other feedback signals (e.g., 203(i), 205(i)), the adjustment logic 230 automatically changes the number representations 202(i) that are used in the computational units 210 and 220, thus changing the precision of the calculations performed in these computational units dynamically, without stopping execution. In one embodiment, the FPGA clock is not stopped between subsequent calculations using different number representations in the same computational units 210 and/or 220. In an alternative embodiment, the computational units 210 and 220 are reconfigured to use the number representations 202(i) while execution is stopped (e.g., the FPGA clock is stopped). In one embodiment, the computational units 210 and 220 are reconfigured to use different number representations 202(i) by the programming logic 111 in the host device 110 or programming logic in the individual FPGA devices 121-123. Once either or both of the computational units 210 and 220 have been reconfigured to use the new number representations 202(i) (either dynamically or by pausing execution), the computational units 210 and 220 in the next iteration calculate a new output 203(i+1) based on the input 201(i+1) using the new number representations 202(i).

In one embodiment, each of the computational units 210 and 220 includes mixed precision logic 211 and 221, respectively, for performing mixed precision calculations, in which operations are performed with values represented according to different number representations. Mixed precision calculations can include, for example, adding a 16 bit floating point number with a 32 bit floating point number. Since the computational units 210 and 220 may use different number representations depending on how they are configured, the mixed precision logic 211 and 221 enables calculations to be performed between values generated by computational units 210 and 220 that are represented according to different number representations. For example, for any of the iterations i, if the computational unit 210 uses a different number representation than the computational unit 220, the mixed precision logic 221 allows the computational unit 220 to perform the mixed precision calculation in order to calculate the output 203(i).

Accordingly, when the adjustment logic 230 or the programming logic 111 changes the number representation used in either or both of the computational units 210 and 220, the adjustment logic 230 or programming logic 111 also reconfigures the mixed precision logic 211 and/or 221 to accommodate the change. While FIG. 2 illustrates a set of two computational units 210 and 220, alternative embodiments may include any number of computational units operating according to similar principles as computational units 210 and 220.

Figure 3A:
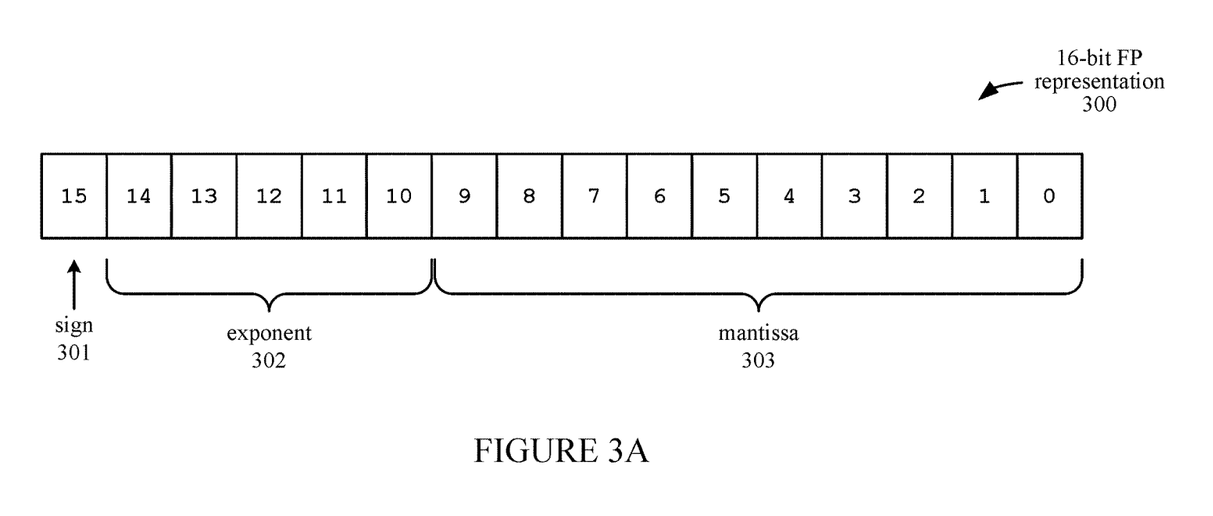
FIGS. 3A-3C illustrate number representations that can be used for performing computations in the computational units, according to an embodiment.
Figure 3B:
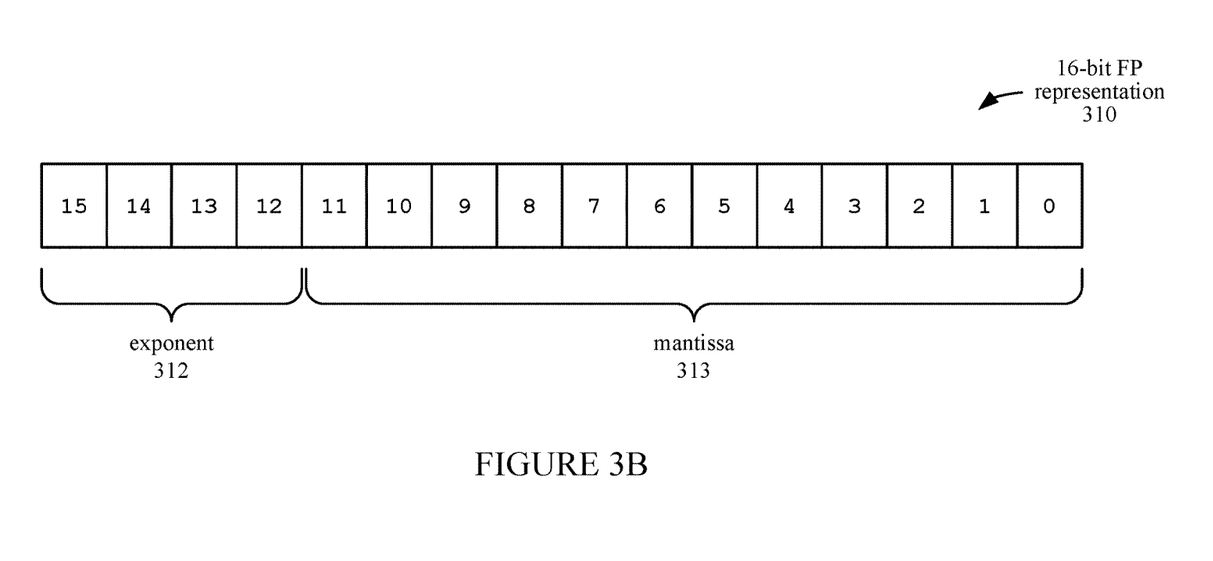
Figure 3C:
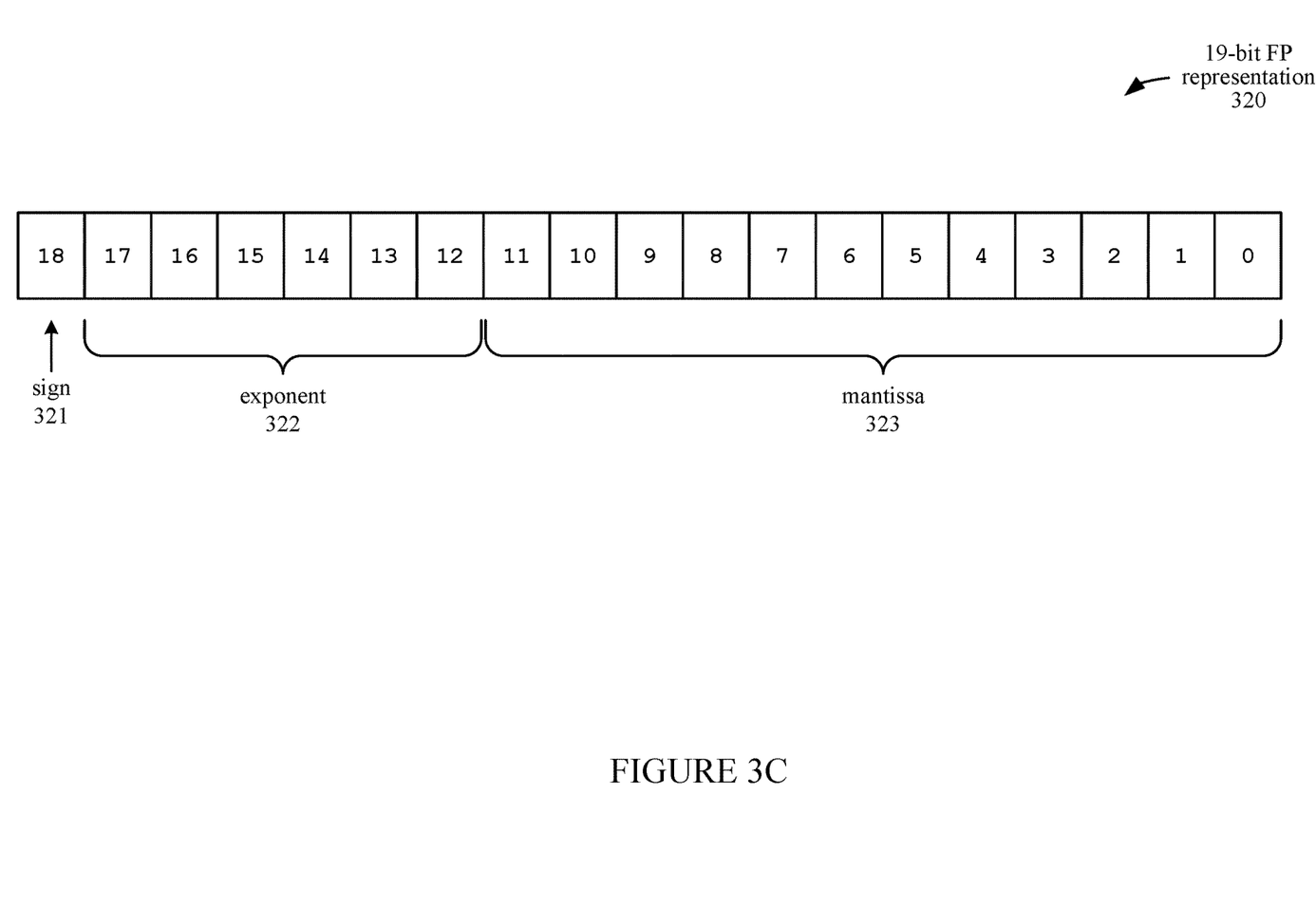

FIGS. 3A, 3B, and 3C illustrate some of the number representations that can be used in the computational units 210 and 220, according to an embodiment. FIG. 3A illustrates a 16 bit floating point (FP) representation 300 that includes sign 301, exponent 302, and mantissa 303 fields. In particular, bits 0-9 are allocated to representing the mantissa 303, bits 10-14 are allocated to representing the exponent 302, and bit 15 is allocated as a sign bit 301. In addition to the 16 bit FP representation 300 as illustrated in FIG. 3A, the computational units 210 and 220 can also utilize other standard representations, as described in the IEEE Standard for Floating-Point Arithmetic (IEEE 754). However, due to the reconfigurable nature of the FPGA devices 121-123, the number of bits used for the sign bit, mantissa and fraction can be dynamically adjusted during run time, so that non-standard number representations can also be used.

FIG. 3B illustrates a non-standard 16 bit FP representation 310 that has the same number of total bits as the standard representation 300, but allocates a different number of bits for each of the sign, exponent 312 and mantissa 313 fields as compared to the 16 bit FP representation 300. The 16 bit FP representation 310 includes no sign bits, allocates bits 0-11 to the mantissa 313, and allocates bits 12-15 to the exponent 312. The 16 bit FP representation 310 is more optimal for representing numbers that are not expected to have different signs (e.g., numbers that will always be positive) and where the numbers are expected to have a smaller dynamic range, as compared to the range of the standard 16 bit FP representation 300. In the 16 bit FP representation 310, a greater number of significant figures (i.e., higher precision) can be obtained by allocating fewer bits for representing the exponent 312 and more bits for representing the mantissa 313. In the case of very large numbers, a larger mantissa may reduce round-off error accumulation.

In addition to the standard lengths, number representations having non-standard total bit lengths can also be used. In one embodiment, the total number of bits in the non-standard number representation is not a power of 2; that is, the total number of bits in the number representation is not equal to 2n, where n is a natural number. FIG. 3C illustrates a non-standard 19 bit FP representation, according to an embodiment. The 19 bit FP representation 320 provides greater precision than a standard 16 bit FP representation, and can be used in computations with lower power and computational costs than a standard 32 bit FP representation. Accordingly, an optimal balance between precision and computational or power cost for a particular task may be provided by a non-standard representation such as the 19 bit FP representation 320. In one embodiment, the adjustment logic 230 determines the optimal representation bit length by changing the number of bits in the number representation being used in the computational units 210 and 220 over the course of multiple iterations while monitoring feedback signals (e.g., 203(i), 205(i)) for a desired result. In addition to the floating point representations as described above, other types of standard and non-standard number representations are also supported, such as integer and fixed point representations.

Figure 4:
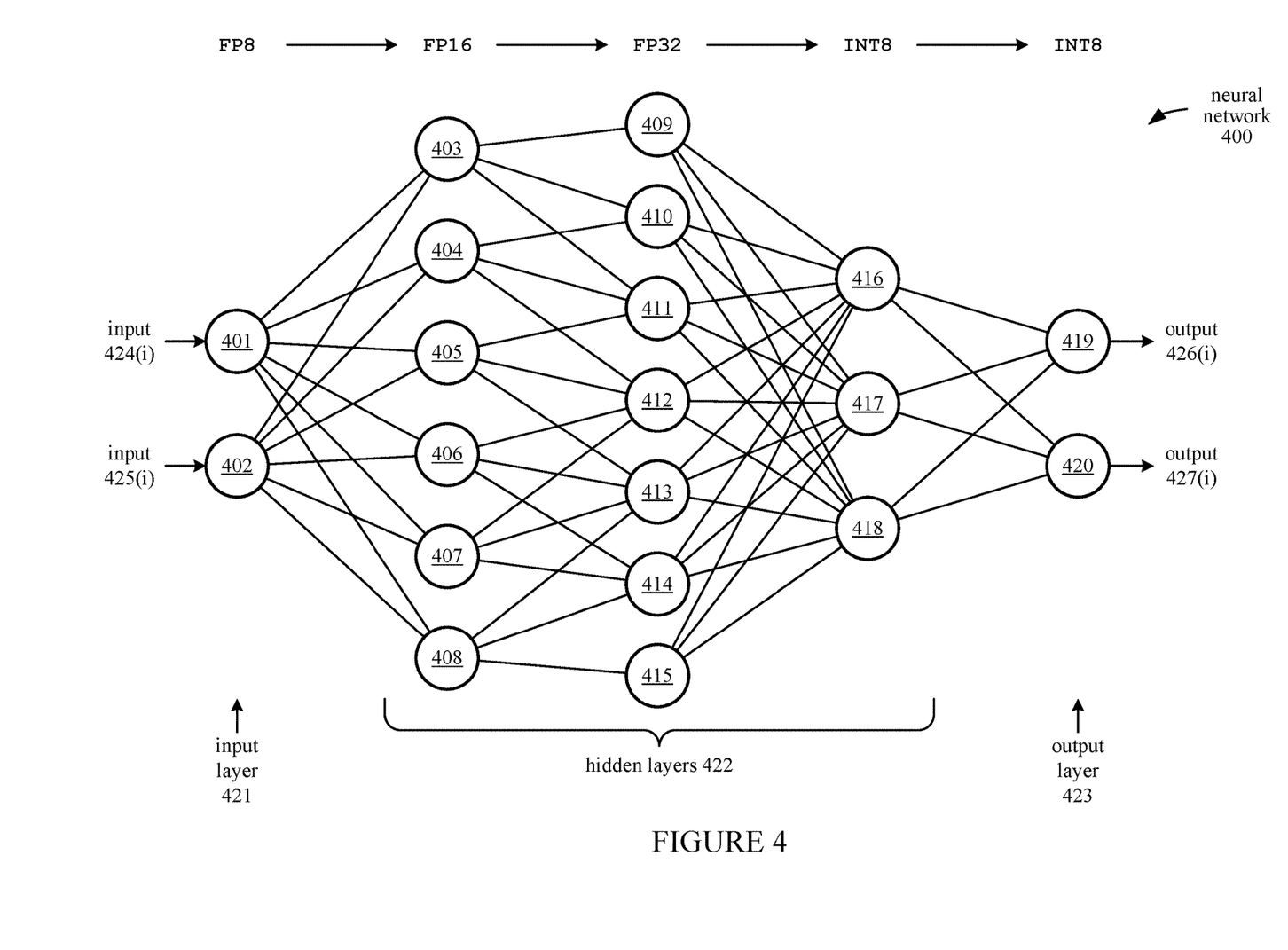
FIG. 4 illustrates a neural network that supports variable number precisions, according to an embodiment.

In one embodiment, multiple computational units can be arranged in a neural network 400, as illustrated in FIG. 4, which can be used for machine learning tasks. FPGA devices used for implementing neural networks can achieve short latency times for performing inference tasks, in which less computation is performed than for training cases. However, similar benefits may also be achieved for some machine learning training cases as well. FPGA devices are also more flexible than other solutions such as application specific integrated circuits (ASICs) in that FPGA devices can be rapidly reconfigured for different neural networks without suffering from degraded performance due to limitations in supported instruction set operations. The reconfigurable nature of FPGA devices is also well suited for supporting variable precision calculations.

The neural network 400 includes neurons 401-420, which are implemented by configuring the configurable logic blocks of FPGA devices 121-123. Neural network 400 is illustrated as including twenty neurons 401-420 and can represent the entire neural network or a portion of a larger network. In some embodiments, a neural network can include any number of neurons, with some neural networks having up to $10^7$ neurons or more. The neurons in a neural network can be connected according to a variety of different topologies. In one embodiment, the neurons are connected in layers. In one embodiment, each of the neurons 401-420 is implemented by a computational unit. For example, two of the connected neurons 401 and 405 may be implemented by computational units 210 and 220, respectively, with the output 203(i) connected to one or more neurons in subsequent layers.

As illustrated in FIG. 4, the neurons 401-420 in neural network 400 are connected in sequential layers, including an initial input layer 421, three subsequent hidden layers 422, and a final output layer 423. Accordingly, each of the neurons 401-420 is connected to other neurons as indicated by the line segments. Data flow in the neural network 400 proceeds from left to right; that is, each neuron receives inputs via connections at its left side and transmits output signals from its right side. In the neural network 400, the neurons in each layer receive their inputs from the neurons in preceding layers. For example, the neurons 403-408 receive their inputs only from the preceding input layer 421. Also, the neurons in each layer transmit their outputs only to neurons in subsequent layers. For example, the neurons 403-408 each transmit their outputs to the neurons 409-415. In neural network 400, neurons do not receive inputs from or transmit outputs to other neurons in the same layer.

For each iteration i, the neural network 400 receives inputs 424(i) and 425(i) at input layer neurons 401 and 402, respectively. The input values 424(i) and 425(i) are processed sequentially through the multiple layers 421-423 to generate output values 426(i) and 427(i) at the outputs of neurons 419 and 420, respectively.

In the neural network 400, each neuron in the same layer uses the same number representation, as indicated at the top of FIG. 4. In particular, the neurons 401-402 of the input layer 421 perform calculations using an 8 bit floating point (FP8) representation. Neurons 403-408 utilize a 16 bit floating point (FP16) representation, neurons 409-415 utilize a 32 bit floating point (FP32) representation, neurons 416-418 utilize an 8 bit integer (INT8) representation, and neurons 419-420 in output layer 423 utilize an 8 bit integer (INT8) representation.

In one embodiment, the number representations used in the neural network 400 are changed by the adjustment logic 230 upon invocation of an inference task to be executed in the neural network 400. The adjustment logic 230 refers to the LUT 130, which specifies computational patterns for a given precision level, and configures the network 400 accordingly. The FPGA devices implementing the neural network 400 can be dynamically configured so that registers for subsequent operations are adjacent to registers used by previous operations. For example, for operations of a preceding layer that are performed prior to operations of a subsequent layer, the registers used by the subsequent layer can be placed adjacent to registers used by the preceding layer.

In one embodiment, the operation of a neural network 400 for a machine learning application includes a training phase and an inference phase. During the training phase, input weights for the neurons 401-420 are adjusted based on applying training data to the inputs of the neural network 400 and comparing the resulting outputs 426(i) and 427(i) with expected or desired outputs. In addition, the training phase includes varying the precision of the different layers 421-423 by changing the number representations used by the layers 421-423 over multiple iterations of the training phase, and checking for a decrease in accuracy after each change. In one embodiment, the training phase can include a large number of iterations, in some cases up to $10^3$-$10^6$ iterations or more.

The inference phase typically follows the training phase and uses the trained neural network to draw conclusions about input data (e.g., identify objects in photographs, identify handwritten letters, etc.). In one embodiment, the precision of the layers 421-423 can be varied by changing the number representation used by the layers 421-423 over multiple iterations of the inference phase, provided that feedback is available for determining if the output is accurate. For example, an interactive application (e.g., voice or handwriting recognition) may allow a user to indicate whether the output is accurate. The precision for the next iteration is then adjusted based on the user indication. In one embodiment, the precisions for each layer of neurons can be adjusted in this manner to determine a range of acceptable precisions within which the final output does not change.

Figure 5:
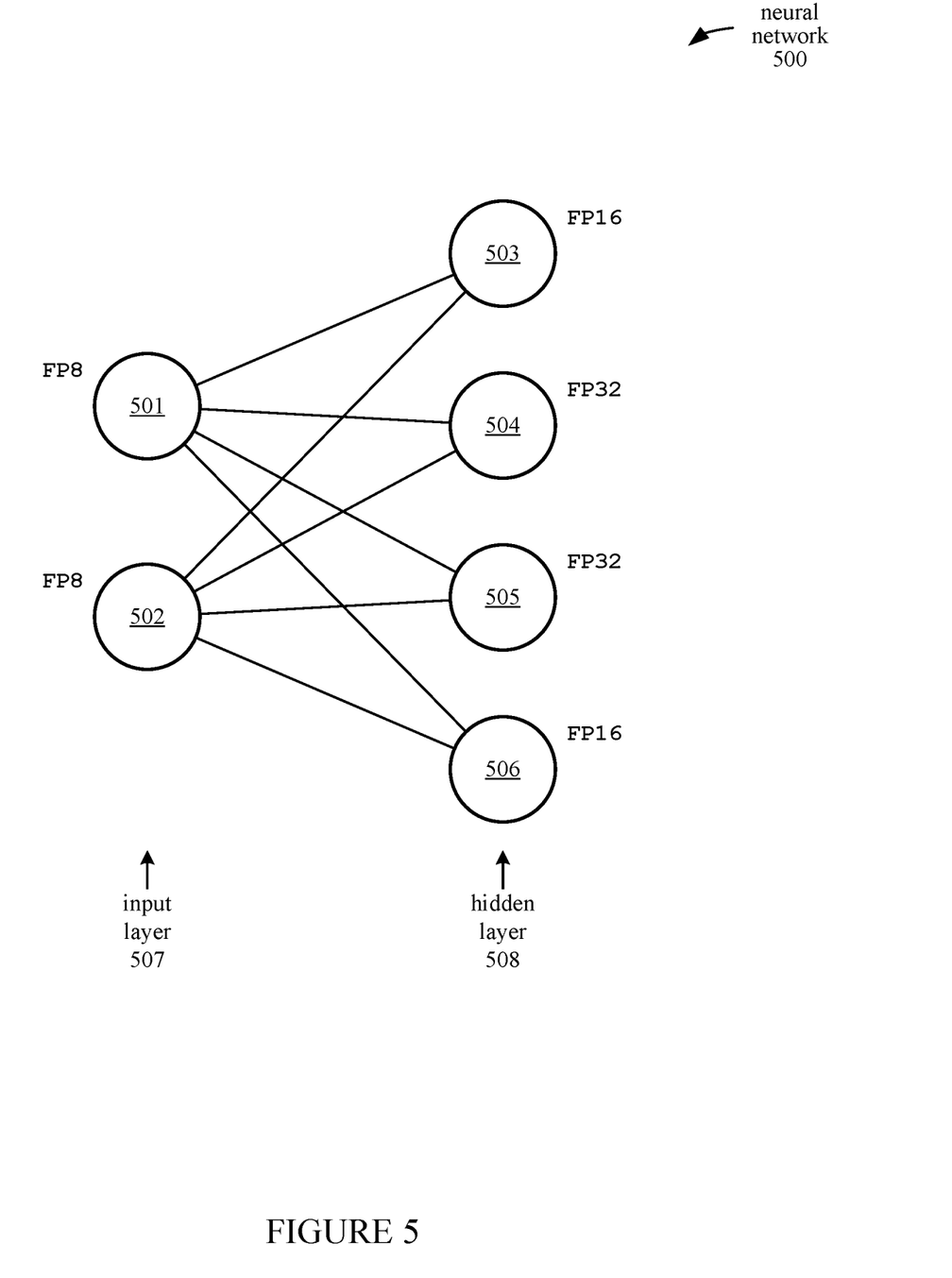
FIG. 5 illustrates a portion of a neural network that supports variable number precisions, according to an embodiment.

FIG. 5 illustrates a portion of a neural network 500, according to an embodiment. The neural network 500 includes neurons 501-502 in an input layer 507 and neurons 503-506 in a hidden layer 508. Each of the neurons 503-506 receives its inputs from the outputs of the neurons 501-502 as indicated by the connecting line segments. In the neural network 500, the number representations used by each of the neurons 501-506 can be changed independently, even for neurons in the same layer. As indicated in FIG. 5, the neurons 501 and 502 utilize an 8 bit floating point representation, neurons 503 and 506 utilize a 16 bit floating point representation, and neurons 504-505 utilize a 32 bit floating point representation. Thus, even neurons in the same layer, such as neurons 505 and 506 can perform calculations using different number representations.

While in some embodiments, a set of computational units that support dynamically changing number representations can be deployed to implement a neural network for machine learning applications, the above approach for dynamically changing computational precision is not limited to machine learning applications. For example, alternative embodiments are used for other applications such as high performance computing (HPC), computational finance, and high frequency trading.

Figure 6:
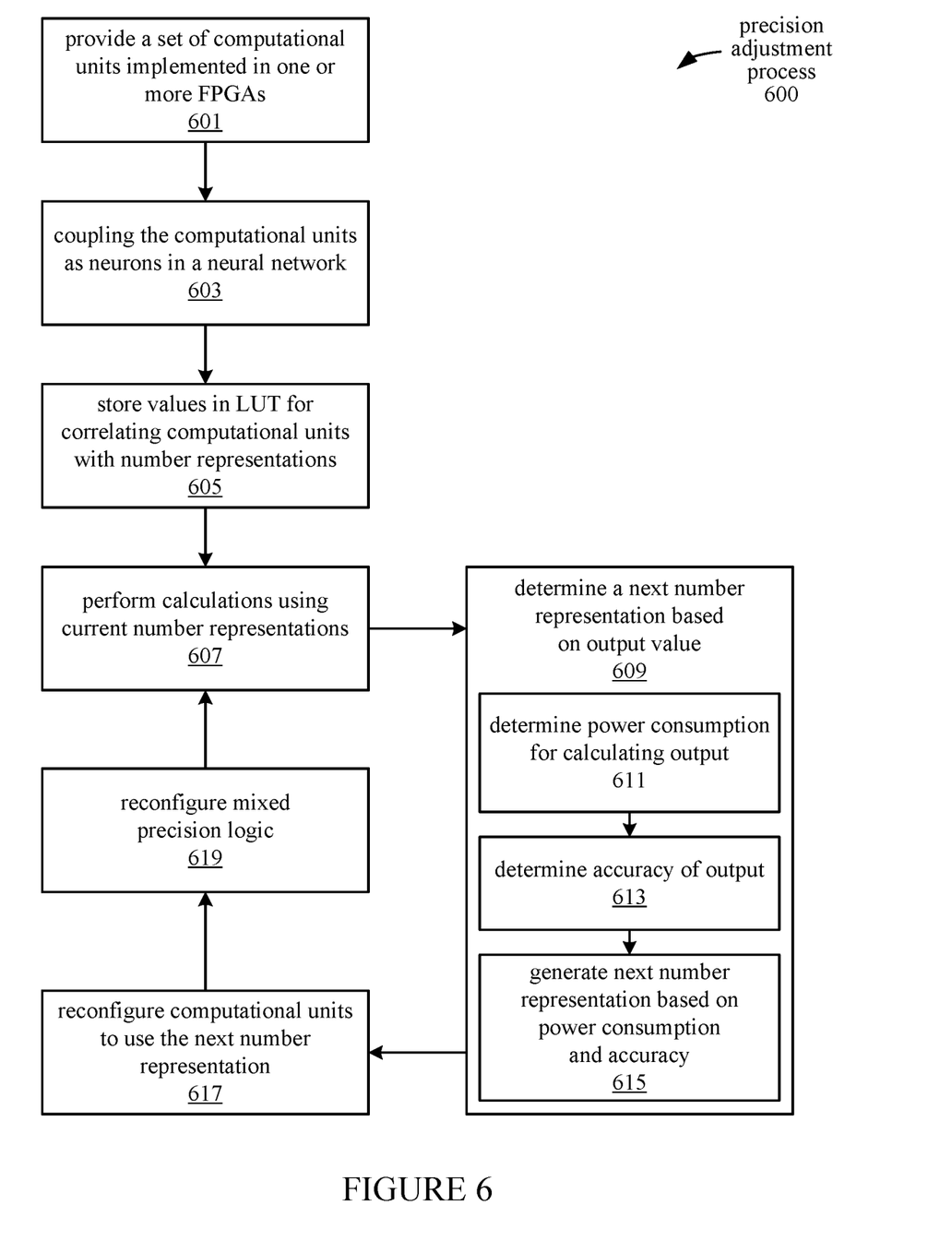
FIG. 6 is a flow diagram illustrating a process for adjusting numerical precision in computational units, according to an embodiment.

FIG. 6 is a flow diagram illustrating a process 600 for adjusting the precision in a set of computational units, according to an embodiment. The operations in process 600 are performed by components in the computing system 100, including the programming logic 111, LUT 130, and adjustment logic 230, and computational units 210 and 220.

The programming logic 111 in the host device 110 is used for programming the FPGA devices 121-123. Accordingly, the computational units 210 and 220 can be implemented in one or more of the FPGA devices 121-123 by using the programming logic 111 to program the configurable logic blocks in the FPGA devices 121-123. In one embodiment, the programming logic 111 programs the FPGA devices 121-123 in response to directions from a user of the host device 110. Once programmed, the set of computational units is thus provided at block 601. Each of the computational units 210 and 220 in the set generates one or more outputs based on one or more input values.

At block 603, the computational units 210 and 220 are coupled with each other and with other neurons in a neural network 400. Accordingly, the computational units 210 and 220 are programmed to function as neurons (e.g., neurons 401 and 405) in the neural network 400. The neurons 401-420 in neural network 400 are arranged in multiple layers 421-423, with each layer including a subset of the neurons 401-420. The set of computational units 210 and 220 are thus connected to each other and to other neurons in the network 400 to generate a set of output values 426(i) and 427(i) based on inputs 424(i) and 425(i) for each iteration i.

At block 605, the LUT 130 (or LUT 112 in alternative embodiments) stores values correlating each of the computational units 210 and 220 with a corresponding number representation. The LUT 130 may also store information about computational patterns of the particular neural network 400 that can be used to determine appropriate precision levels for the neurons 401-420. Information in the LUT 130 can be determined at design time and stored in the LUT 130 prior to operation of the neural network 400. Alternatively, the information in the LUT 130 may be updated during operation of the neural network 400.

A first iteration of the neural network 400 begins at block 607. At block 607, each computational unit 410 and 420 calculates its output using an initial number representation. Values used by each computational unit for the calculation are represented according to each computational unit's respective initial number representation. Output values 426(1) and 427(1) for the first iteration are generated based on these calculations performed by the neurons 401-420, which includes the neurons 401 and 405 as implemented by computational units 410 and 420.

At block 609, the adjustment logic 230 determines a next number representation for one or more of the computational units implementing neurons 401-420 (e.g., 210 and 220) based on one or more of the output values 426(1) and 427(1) from the first iteration.

In one embodiment, the next number representation is also determined based on the power consumption for calculating the output values 426(1) and 427(1) and/or the accuracy of the output values 426(1) and 427(1). Accordingly, at block 611, the power consumption for calculating the output values 426(1) and 427(1) is measured and is received by the adjustment logic 230 as a power consumption indication 205(1). At block 613, the adjustment logic 230 determines the accuracy of the output values 426(1) and 427(1) by comparing the output values 426(1) and 427(1) to corresponding reference values 204. In one embodiment, the reference values 204 represent expected output values corresponding to the provided inputs 424(1) and 425(1). At block 615, the adjustment logic 230 determines the next number representation for each computational unit based on the determined power consumption and accuracy.

In one embodiment, the next number representation for each computational unit is generated by adjusting the total bit length or number of bits allocated to each field (e.g., sign, exponent, and/or mantissa) of the initial number representation for the computational unit based on the power consumption and/or accuracy. The next number representation can also be determined based on the values stored in the LUT 130.

The next number representation determined by the adjustment logic 230 can be a standard representation that includes a standard total number of bits, or may include a non-standard total number of bits. In one embodiment, the total number of bits included in the next number representation is not equal to a power of 2 (i.e., 2n, where n is a natural number). Furthermore, in the case where the initial number representation of a given computational unit includes sign, mantissa, and exponent fields, the next number representation may allocate a different number of bits for representing any or all of these fields.

In one embodiment, the number representations for each of the computational units in the same layer are changed together; that is, the next number representation is the same for computational units in the same layer. Alternatively, the number representations for each computational unit may be changed independently, so that the next number representations for two or more computational units in the same layer can be different.

At block 617 the adjustment logic 230 reconfigures each of the computational units in the neural network 400 to use the next number representation as determined for the computational unit at block 609. In one embodiment, this reconfiguration is performed dynamically. In an alternative embodiment, the reconfiguration can be performed by stopping execution (e.g., stopping the FPGA clock) and reconfiguring the configurable logic blocks in the FPGA devices using the programming logic 111. After the reconfiguration, the 'next' number representation becomes the 'current' number representation in each of the reconfigured computational units.

At block 619, the adjustment logic also reconfigures mixed precision logic (e.g., mixed precision logic 211 and 221) for the computational units that are reconfigured to use a new number representation. Since each computational unit can potentially use a different number representation than the computational unit or units from which it receives input values, these computational units may rely on mixed precision calculations to calculate their outputs. Therefore, the mixed precision logic is also reconfigured to accommodate the new number representations.

From block 619, the process 600 returns to block 607 to begin a second iteration. At block 607, each computational unit performs calculations using the current number representation for the computational unit. The output values 426(2) and 427(2) for the second iteration (i=2) are generated based on these calculations by the computational units in network 400. The calculations performed by at least some of the computational units also include mixed precision calculations performed by mixed precision logic reconfigured at block 619.

In one embodiment, the adjustment logic 230 determines a range in which changes in the number precision used in the computational units does not affect the output. One approach for determining such a range involves changing the number representations used in the computational units over each iteration until a change in the output is detected. The input is held constant so that the change in the output cannot be attributed to a change in the input. In such an embodiment, the adjustment logic 230 at block 609 determines whether the outputs 426(2) and 427(2) are equal to (i.e., unchanged from) the outputs 426(1) and 427(1) of the prior iteration. In response to determining that the outputs 426(2) and 427(2) have not changed, the adjustment logic 230 adjusts the number representations for the computational units involved in generating the output values. For example, the adjustment logic 230 decreases the total number of bits in the number representations to be used for the next iteration. However, if the outputs 426(2) and 427(2) have changed relative to the prior outputs 426(1) and 427(1), the adjustment logic 230 reverts to the previously used number representation. By this approach, the adjustment logic 230 determines the set of number representations having the fewest total bits (corresponding to the lowest power and computational cost) that can be used without changing the output.

After reconfiguration of the computational units to use the new number representations, as provided at blocks 617 and 619, the process 600 returns to block 607 to begin a third iteration. At block 607, the computational units calculate output values 426(3) and 427(3) for the third iteration using the updated number representations.

The process 600 thus repeats blocks 607-619 for each of multiple iterations to generate outputs 426(i) and 427(i) for each iteration i, while adjusting the number precision used for performing computations in the computational units functioning as neurons 401-420 in the network 400. At each iteration of block 609, the adjustment logic 230 determines a new number representation based on the output accuracy, power consumption, values in LUT 130, or other signals. This support for a wide variety of both standard and non-standard number representations and the capability of dynamically varying the precision, enabled by the reconfigurable nature of the FPGA devices, allows the computing system to minimize power consumption, memory access frequency, or other computational costs while maintaining a desired degree of accuracy.

As used herein, the term "coupled to" may mean coupled directly or indirectly through one or more intervening components. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines and each of the single signal lines may alternatively be buses.

Certain embodiments may be implemented as a computer program product that may include instructions stored on a non-transitory computer-readable medium. These instructions may be used to program a general-purpose or special-purpose processor to perform the described operations. A computer-readable medium includes any mechanism for storing or transmitting information in a form (e.g., software, processing application) readable by a machine (e.g., a computer). The non-transitory computer-readable storage medium may include, but is not limited to, magnetic storage medium (e.g., floppy diskette); optical storage medium (e.g., CD-ROM); magneto-optical storage medium; read-only memory (ROM); random-access memory (RAM); erasable programmable memory (e.g., EPROM and EEPROM); flash memory, or another type of medium suitable for storing electronic instructions.

Additionally, some embodiments may be practiced in distributed computing environments where the computer-readable medium is stored on and/or executed by more than one computer system. In addition, the information transferred between computer systems may either be pulled or pushed across the transmission medium connecting the computer systems.

Generally, a data structure representing the computing system 100 and/or portions thereof carried on the computer-readable storage medium may be a database or other data structure which can be read by a program and used, directly or indirectly, to fabricate the hardware including the computing system 100. For example, the data structure may be a behavioral-level description or register-transfer level (RTL) description of the hardware functionality in a high level design language (HDL) such as Verilog or VHDL. The description may be read by a synthesis tool which may synthesize the description to produce a netlist including a list of gates from a synthesis library. The netlist includes a set of gates which also represent the functionality of the hardware including the computing system 100. The netlist may then be placed and routed to produce a data set describing geometric shapes to be applied to masks. The masks may then be used in various semiconductor fabrication steps to produce a semiconductor circuit or circuits corresponding to the computing system 100. Alternatively, the database on the computer-readable storage medium may be the netlist (with or without the synthesis library) or the data set, as desired, or Graphic Data System (GDS) II data.

Although the operations of the method(s) herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

In the foregoing specification, the embodiments have been described with reference to specific exemplary embodiments thereof. It will, however, be evident that various modifications and changes may be made thereto without departing from the broader scope of the embodiments as set forth in the appended claims. The specification and drawings are, accordingly, to be regarded in an illustrative sense rather than a restrictive sense.

What is claimed is:

1. A method, comprising:
providing a set of one or more computational units implemented in a set of one or more field programmable gate array (FPGA) devices, wherein the set of one or more computational units is configured to generate a plurality of output values based on one or more input values; and
for each computational unit of the set of computational units,
  performing a first calculation in the computational unit using a first number representation, wherein a first output of the plurality of output values is based on the first calculation,
  determining a second number representation based on the first output value and based on one or more values associated with the computational unit in a lookup table (LUT),
  in response to the determining the second number representation, reconfiguring the computational unit, and
  performing a second calculation in the computational unit using the second number representation, wherein a second output of the plurality of output values is based on the second calculation.

2. The method of claim 1, further comprising:
reconfiguring mixed precision logic in the one or more FPGA devices, wherein performing the second calculation comprises performing a mixed precision calculation in the mixed precision logic.

3. The method of claim 1, further comprising:
storing a plurality of values in a lookup table (LUT) correlating each of the computational units with a corresponding number representation.

4. The method of claim 1, wherein determining the second number representation further comprises:
determining a power consumption for calculating the first output value;
determining an accuracy of the first output value; and
generating the second number representation by adjusting the first number representation based on the power consumption and the accuracy.

5. The method of claim 1, further comprising, for each computational unit of the set of computational units:

in response to determining that the first output value is equal to the second output value, generating a third number representation having fewer total bits than the second number representation; and performing a third calculation in the computational unit using the third number representation, wherein a third output value of the plurality of output values is based on the third calculation.

6. The method of claim 1, wherein a total number of bits in the second number representation is not equal to $2^n$, wherein n is a natural number.

7. The method of claim 1, wherein:
the first number representation and the second number representation each include a mantissa field and an exponent field, and
the second number representation allocates a different number of bits for each of the mantissa field and the exponent field than the first number representation.

8. The method of claim 1, further comprising:
coupling each computational unit of the set of computational units as a neuron in a neural network comprising multiple layers, wherein each of the multiple layers comprises a subset of the set of computational units; and
performing calculations using the same number representation for each subset of the computational units in the same layer.

9. The method of claim 1, wherein:
each computational unit in the set of computational units functions as a neuron in a neural network comprising multiple layers, and
for at least one layer of the multiple layers, at least one computational unit in the layer is configured to calculate an output using a different number representation than another computational unit in the layer.

10. An apparatus, comprising:
a set of computational units implemented in a set of one or more field programmable gate array (FPGA) devices and configured to generate a plurality of output values based on one or more input values, wherein each of the computational units is configured to:
perform a first calculation using a first number representation, wherein a first output value of the plurality of output values is based on the first calculation, and
perform a second calculation using a second number representation, wherein a second output of the plurality of output values is based on the second calculation; and
adjustment logic configured to determine the second number representation for each computational unit in the set of computational units based on the first output value and based on one or more values associated with the computational unit in a lookup table (LUT), wherein each of the computational units is reconfigured in response to determining the second number representation.

11. The apparatus of claim 10, further comprising:
mixed precision logic in the one or more FPGA devices configured to perform a mixed precision calculation, wherein the second calculation comprises the mixed precision calculation.

12. The apparatus of claim 10, wherein:
the LUT is configured to store a plurality of values correlating each of the computational units with a corresponding number representation.

13. The apparatus of claim 10, wherein the adjustment logic is further configured to determine the second number representation by:
determining a power consumption for calculating the first output value;
determining an accuracy of the first output value; and
generating the second number representation based on adjusting the first number representation based on the power consumption and the accuracy.

14. The apparatus of claim 10, wherein for each computational unit of the set of computational units:
the adjustment logic is further configured to generate a third number representation having fewer total bits than the second number representation in response to determining that the first output value is equal to the second output value, and
the computational unit is further configured to perform a third calculation using the third number representation, wherein a third output value of the plurality of output values is based on the third calculation.

15. The apparatus of claim 10, wherein:
the first number representation and the second number representation each include a mantissa field and an exponent field, and
the second number representation allocates a different number of bits for each of the mantissa field and the exponent field than the first number representation.

16. The apparatus of claim 10, wherein the computational units of the set of computational units are coupled as neurons in a neural network comprising multiple layers in a sequence,
wherein for at least one layer of the multiple layers, computational units in the layer are configured to receive input values from one or more preceding layers in the sequence and are configured to transmit output values to one or more subsequent layers in the sequence, and
wherein at least one computational unit in the layer is configured to perform calculations using a different number representation than another computational unit in the layer.

17. A system, comprising:
a host device;
programming logic coupled with the host device and configured to program a set of one or more field programmable gate array (FPGA) devices;
a set of computational units implemented in the set of one or more field programmable gate array (FPGA) devices and configured to generate a plurality of output values based on one or more input values, wherein each of the computational units is configured to:
perform a first calculation using a first number representation, wherein a first output value of the plurality of output values is based on the first calculation, and
perform a second calculation using a second number representation, wherein a second output of the plurality of output values is based on the second calculation; and
adjustment logic configured to determine the second number representation for each computational unit in the set of computational units based on the first output value and based on one or more values associated with the computational unit in a lookup table (LUT), wherein each of the computational units is reconfigured in response to determining the second number representation.

18. The system of claim 17, wherein the programming logic is configured to:
- for each computational unit of the set of computational units, reconfigure the computational unit to perform the second calculation using the second number representation; and
- reconfigure mixed precision logic in the one or more FPGA devices to perform a mixed precision calculation using the second number representation, wherein the second calculation comprises the mixed precision calculation.

19. The system of claim 17, wherein:
- the adjustment logic is located in the host device and is configured to determine the second number representation based on determining an accuracy of the first output value and based on determining a power consumption for calculating the first output value,
- the first number representation and the second number representation each include a mantissa field and an exponent field,
- the second number representation allocates a different number of bits for each of the mantissa field and the exponent field than the first number representation, and
- the second number representation has a different total number of bits than the first number representation.

20. The system of claim 17, wherein the host device is coupled with the set of FPGA devices over a network.

* * * * *